United States Patent
Peidous et al.

(10) Patent No.: US 9,831,115 B2
(45) Date of Patent: Nov. 28, 2017

(54) PROCESS FLOW FOR MANUFACTURING SEMICONDUCTOR ON INSULATOR STRUCTURES IN PARALLEL

(71) Applicant: SunEdison Semiconductor Limited (UEN201334164H), Singapore (SG)

(72) Inventors: Igor Peidous, Eaton, OH (US); Andrew M. Jones, Wildwood, MO (US); Srikanth Kommu, St. Charles, MO (US); Jeffrey L. Libbert, O'Fallon, MO (US)

(73) Assignee: SunEdison Semiconductor Limited (UEN201334164H) (SG)

( * ) Notice: Subject to any disclaimer, the term of this patent is extended or adjusted under 35 U.S.C. 154(b) by 0 days.

(21) Appl. No.: 15/435,428

(22) Filed: Feb. 17, 2017

(65) Prior Publication Data

US 2017/0243781 A1    Aug. 24, 2017

Related U.S. Application Data

(60) Provisional application No. 62/297,243, filed on Feb. 19, 2016.

(51) Int. Cl.
*H01L 21/762* (2006.01)
*H01L 21/324* (2006.01)
*H01L 29/04* (2006.01)
*H01L 29/40* (2006.01)
*H01L 29/30* (2006.01)
(Continued)

(52) U.S. Cl.
CPC ...... *H01L 21/76251* (2013.01); *H01L 21/187* (2013.01); *H01L 21/26506* (2013.01); *H01L 21/28282* (2013.01); *H01L 29/045* (2013.01); *H01L 29/30* (2013.01); *H01L 29/408* (2013.01)

(58) Field of Classification Search
CPC . H01L 27/1203; H01L 21/84; H01L 29/0649; H01L 29/792; H01L 21/2007; H01L 21/30604; H01L 21/02112; H01L 21/02167; H01L 21/0217; H01L 21/324; H01L 21/76254; H01L 27/12
See application file for complete search history.

(56) References Cited

U.S. PATENT DOCUMENTS

| | | |
|---|---|---|
| 4,501,060 A | 2/1985 | Frye et al. |
| 4,755,865 A | 7/1988 | Wilson et al. |

(Continued)

FOREIGN PATENT DOCUMENTS

| | | |
|---|---|---|
| EP | 0939430 A2 | 1/1999 |
| EP | 1865551 A1 | 12/2007 |

(Continued)

OTHER PUBLICATIONS

Gamble, H.S. et al., Low-loss CPW Lines on Surface Stabilized High-Resistivity Silicon, IEEE Microwave and Guided Waves Letters, Oct. 1999, pp. 395-397, vol. 9, No. 10.

(Continued)

*Primary Examiner* — Roy Potter
(74) *Attorney, Agent, or Firm* — Armstrong Teasdale LLP

(57) ABSTRACT

A cost effective process flow for manufacturing semiconductor on insulator structures is parallel is provided. Each of the multiple semiconductor-on-insulator composite structures prepared in parallel comprises a charge trapping layer (CTL).

23 Claims, 10 Drawing Sheets

(51) Int. Cl.
  *H01L 21/28* (2006.01)
  *H01L 21/18* (2006.01)
  *H01L 21/265* (2006.01)

(56) References Cited

U.S. PATENT DOCUMENTS

| | | |
|---|---|---|
| 4,968,384 A | 11/1990 | Asano |
| 5,189,500 A | 2/1993 | Kusunoki |
| 6,043,138 A | 3/2000 | Ibok |
| 6,373,113 B1 | 4/2002 | Gardner et al. |
| 6,562,127 B1 | 5/2003 | Kud et al. |
| 6,624,047 B1 | 9/2003 | Sakaguchi et al. |
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 2002/0090758 A1 | 7/2002 | Henley et al. |
| 2004/0005740 A1 | 1/2004 | Lochtefeld et al. |
| 2004/0031979 A1 | 2/2004 | Lochtefeld et al. |
| 2004/0108537 A1 | 6/2004 | Tiwari |
| 2005/0153524 A1 | 7/2005 | Maa et al. |
| 2005/0167002 A1 | 8/2005 | Ghyselen et al. |
| 2006/0030124 A1 | 2/2006 | Maa et al. |
| 2006/0033110 A1 | 2/2006 | Alam et al. |
| 2006/0226482 A1 | 10/2006 | Suvorov |
| 2007/0032040 A1 | 2/2007 | Lederer |
| 2007/0054466 A1 | 3/2007 | Hebras |
| 2009/0004833 A1 | 1/2009 | Suzuki et al. |
| 2009/0014828 A1 | 1/2009 | Mizushima et al. |
| 2009/0092810 A1 | 4/2009 | Lee et al. |
| 2009/0321829 A1 | 12/2009 | Nguyen et al. |
| 2011/0174362 A1 | 7/2011 | Tanner et al. |
| 2011/0298083 A1 | 12/2011 | Yoneda |
| 2012/0091587 A1 | 4/2012 | Or-Bach et al. |
| 2012/0161310 A1 | 6/2012 | Brindle et al. |
| 2012/0238070 A1 | 9/2012 | Libbert et al. |
| 2012/0267681 A1 | 10/2012 | Nemoto et al. |
| 2013/0120951 A1 | 5/2013 | Zuo et al. |
| 2013/0122672 A1 | 5/2013 | Or-Bach et al. |
| 2013/0168835 A1 | 7/2013 | Botula et al. |
| 2013/0193445 A1 | 8/2013 | Dennard et al. |
| 2013/0294038 A1 | 11/2013 | Landru et al. |
| 2013/0344680 A1 | 12/2013 | Arriagada et al. |
| 2014/0042598 A1 | 2/2014 | Kitada et al. |
| 2014/0070215 A1 | 3/2014 | Bedell et al. |
| 2014/0084290 A1 | 3/2014 | Allibert et al. |
| 2014/0120654 A1 | 5/2014 | Fujii et al. |
| 2014/0124902 A1 | 5/2014 | Botula et al. |
| 2014/0273405 A1 | 9/2014 | Liu et al. |
| 2015/0004778 A1 | 1/2015 | Botula et al. |
| 2015/0115480 A1 | 4/2015 | Peidous et al. |
| 2016/0071760 A1* | 3/2016 | Liu .......... H01L 21/02112 257/506 |
| 2017/0062452 A1* | 3/2017 | Syu .......... H01L 27/1203 |

FOREIGN PATENT DOCUMENTS

| | | |
|---|---|---|
| EP | 2426701 A1 | 7/2012 |
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, A et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pgs. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546 vol. 72, No. 20.

* cited by examiner

PROCESS FLOW FOR MANUFACTURING SEMICONDUCTOR ON INSULATOR STRUCTURES IN PARALLEL

CROSS REFERENCE TO RELATED APPLICATION(S)

This application claims the benefit of priority to U.S. provisional application Ser. No. 62/297,243, which was filed Feb. 19, 2016, the disclosure of which is hereby incorporated by reference as if set forth in its entirety.

FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one method of creating a semiconductor-on-insulator structure 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

The present invention is directed to a method of preparing a plurality of multilayer structures, the method comprising: (a) providing an initial bonded structure, the initial bonded structure comprising an initial single crystal semiconductor handle substrate, an initial dielectric layer in contact with a front surface of the initial single crystal semiconductor handle substrate, and an initial single crystal semiconductor donor substrate in contact with the initial dielectric layer, wherein the initial single crystal semiconductor donor substrate has a minimum bulk region resistivity of at least about 500 ohm-cm and further wherein the initial single crystal semiconductor donor substrate comprises an initial cleave plane; (b) mechanically cleaving the initial bonded structure at the initial cleave plane to thereby prepare an initial cleaved structure and a second single crystal semiconductor handle substrate, wherein the initial cleaved structure comprises the initial single crystal semiconductor handle substrate, the initial dielectric layer in contact with the front surface of the initial single crystal semiconductor handle substrate, and a first single crystal semiconductor device layer in contact with the initial dielectric layer, wherein the first single crystal semiconductor device layer has a minimum bulk region resistivity of at least about 500 ohm-cm and has a roughened front surface having a surface roughness of at least about 0.1 micrometers as measured according to the root mean square method over a surface area of at least 30 micrometers by 30 micrometers, and further wherein the second single crystal semiconductor handle substrate has a minimum bulk region resistivity of at least about 500 ohm-cm and has a roughened front surface having a surface roughness of at least about 0.1 micrometers as measured according to the root mean square method over a surface area of at least 30 micrometers by 30 micrometers; (c) depositing a first charge trapping layer on the roughened front surface of the first single crystal semiconductor device layer of the initial cleaved structure, the first charge trapping layer comprising polycrystalline silicon, the polycrystalline silicon comprising grains having a plurality of crystal orientations; (d) bonding a first dielectric layer on a front surface of a first single crystal semiconductor donor substrate to the first charge trapping layer on the roughened front surface of the first single crystal semiconductor device layer of the initial cleaved structure to thereby prepare a first multilayer structure, the first multilayer structure comprising the initial single crystal semiconductor handle substrate, the initial dielectric layer in contact with the front surface of the initial single crystal semiconductor handle substrate, the first single crystal semiconductor device layer in contact with the initial dielectric layer, the first charge trapping layer in contact with the roughened front surface of the first single crystal semiconductor device layer, the first dielectric layer in contact with the first charge trapping layer, and the first single crystal semiconductor donor substrate in contact with the first dielectric layer; (e) depositing a second charge trapping layer on the roughened front surface of the second single crystal semiconductor handle substrate, the second charge trapping layer comprising polycrystalline silicon, the polycrystalline silicon comprising grains having a plurality of crystal orientations; and (f) bonding a second dielectric layer on a front surface of a second single crystal semiconductor donor substrate to the second charge trapping layer on the roughened front surface of the second single crystal semiconductor handle substrate to thereby prepare a second multilayer structure, the second multilayer structure comprising the second single crystal semiconductor handle substrate, the second charge trapping layer in contact with the roughened front surface of the second single crystal semiconductor handle substrate, the second dielectric layer in contact with the second charge trapping layer, and the second single crystal semiconductor donor substrate in contact with the second dielectric layer.

The present invention is further directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate; a handle dielectric layer in interfacial contact with the front surface of the single crystal semiconductor handle substrate; a high resistivity single crystal semiconductor layer in interfacial contact with the dielectric layer, wherein the high resistivity single crystal semiconductor layer has a minimum bulk resistivity of at least about 500 ohm-cm and further comprises a roughened front surface having a surface roughness of at least about 0.1 micrometers as measured according to the root mean square method over a surface area of at least 30 micrometers by 30 micrometers; a charge trapping layer in interfacial contact with the roughened front surface of the high resistivity single crystal semiconductor layer, the charge trapping layer comprising polycrystalline silicon, the polycrystalline silicon comprising grains having a plurality of crystal orientations; a donor dielectric layer in interfacial contact with the charge trapping layer, and a single crystal semiconductor donor layer in interfacial contact with the donor dielectric layer.

Other objects and features will be in part apparent and in part pointed out hereinafter.

DETAILED DESCRIPTION OF THE EMBODIMENT(S) OF THE INVENTION

Figure 1:
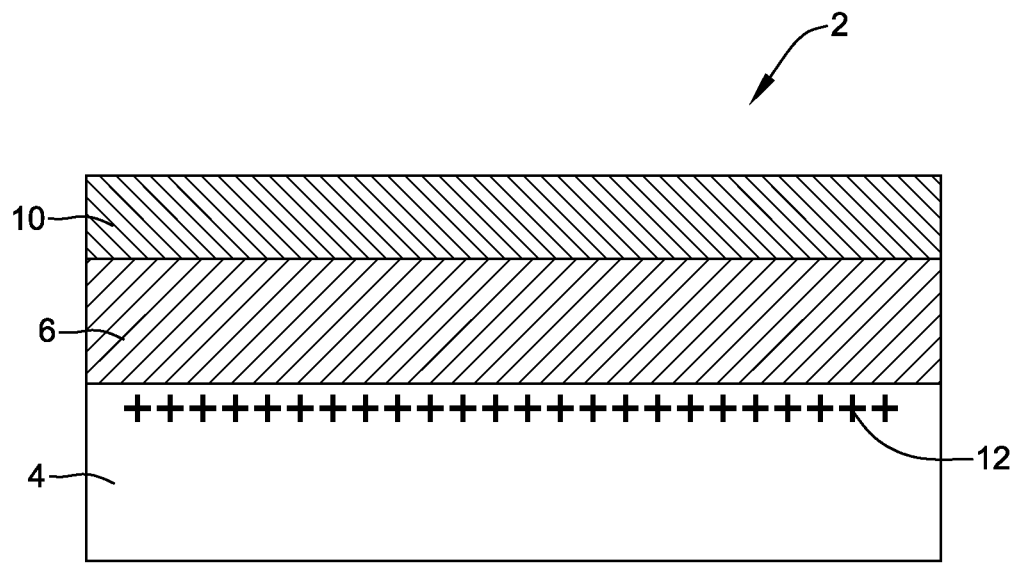
FIG. 1 is a depiction of a silicon-on-insulator wafer comprising a high resistivity substrate and a buried oxide layer.
Figure 2:
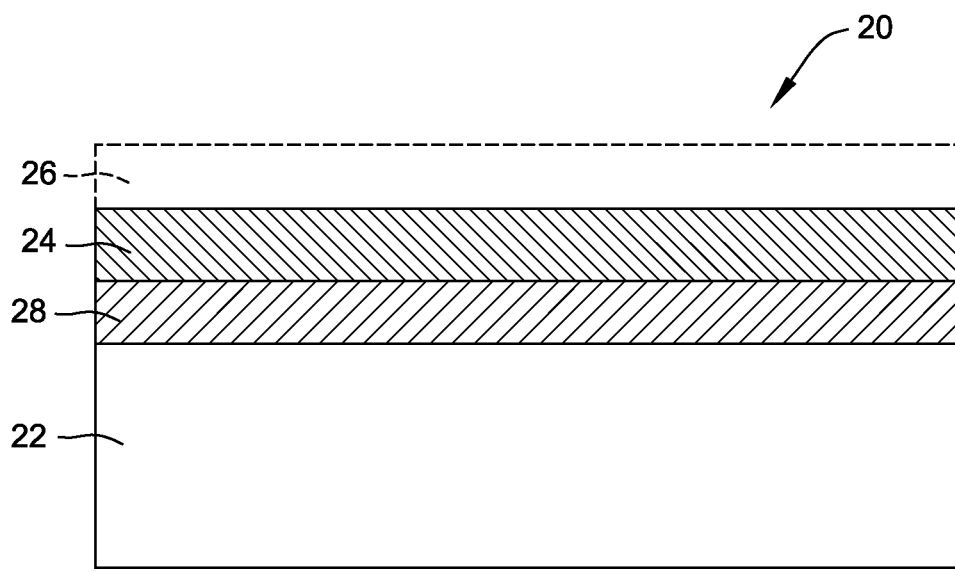
FIG. 2 is a depiction of a silicon-on-insulator wafer according to the prior art, the SOI wafer comprising a polysilicon charge trapping layer between a high resistivity substrate and a buried oxide layer.

According to the present invention, a method is provided for preparing multiple semiconductor-on-insulator composite structures (SOI, e.g., a silicon-on-insulator composite structure) in parallel. Each of the multiple semiconductor-on-insulator composite structures prepared in parallel comprises a charge trapping layer (CTL). The present invention is further directed to a semiconductor-on-insulator composite structure (e.g., a silicon-on-insulator composite structure) comprising a charge trapping layer (CTL). In some embodiments, the method of the present invention provides a semiconductor-on-insulator (e.g., silicon-on-insulator) comprising a high resistivity handle substrate comprising a front surface layer prepared with a minimum surface roughness. The charge trapping layer is prepared upon the roughened front surface layer. In some embodiments, the method of the present invention provides a semiconductor-on-insulator (e.g., silicon-on-insulator) comprising a buried high resistivity layer in between a charge trapping layer and one or more sacrificial layers.

In some embodiments, the method of the present invention provides a semiconductor-on-insulator (SOI, e.g., silicon-on-insulator) comprising a high resistivity handle substrate comprising a front surface layer prepared with a minimum surface roughness. The charge trapping layer prepared upon the roughened front surface layer of the high resistivity handle substrate comprises polycrystalline silicon. Deposition of a charge trapping layer comprising polycrystalline silicon upon a roughened front surface layer yields a CTL layer of enhanced thermal stability. During conventional semiconductor-on-insulator (SOI, e.g., silicon-on-insulator) and device fabrication, the CTL is subjected to high temperature anneals which cause, at least, partial recrystallization of the polycrystalline silicon CTL material. The recrystallization is seeded by the substrate and occurs at multiple polycrystalline silicon grains which grow in size and merge with grain boundaries thereby annihilating distinct grains because the grains acquire the same crystal orientation as the surface of the substrate. According to some embodiments of the method of the present invention, the front surface layer of the handle substrate is roughened and has different orientation at localized spots. The polycrystalline silicon recrystallizes, during a high temperature process step, in grains on the substrate surface with different crystallographic orientations and having different activation and grain growth rate. As a result, even a recrystallized polycrystalline silicon CTL has highly defective structure and preserves the intended charge trapping efficiency. Accordingly, the rough interface in the structure may trap charges and effectively scatters charge carriers in silicon. Therefore, in case of formation of inversion or charge accumulation layers at the substrate surface, the parasitic conduction of the substrate is lower. Accordingly, the RF performance of the charge trapping layer prepared according to the method of the present invention is improved.

In some embodiments, the method of the present invention provides a semiconductor-on-insulator (e.g., silicon-on-insulator) comprising a buried high resistivity layer in between a charge trapping layer and one or more sacrificial layers. Advantageously, the structure comprising the sacrificial substrate may not have resistivity, purity, and defectivity restrictions and, therefore, it has low cost. It is preferably stable against formation of slip line defects that may be provided with high concentration of oxygen in the substrate material. In some embodiments, the sacrificial substrate is intended to be removed after RF devices are fabricated in/on SOI wafer.

I. Semiconductor Handle Substrate and Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. FIGS. 3A through 3H depict the process flow according to some embodiments of the present invention.

Figure 3A:
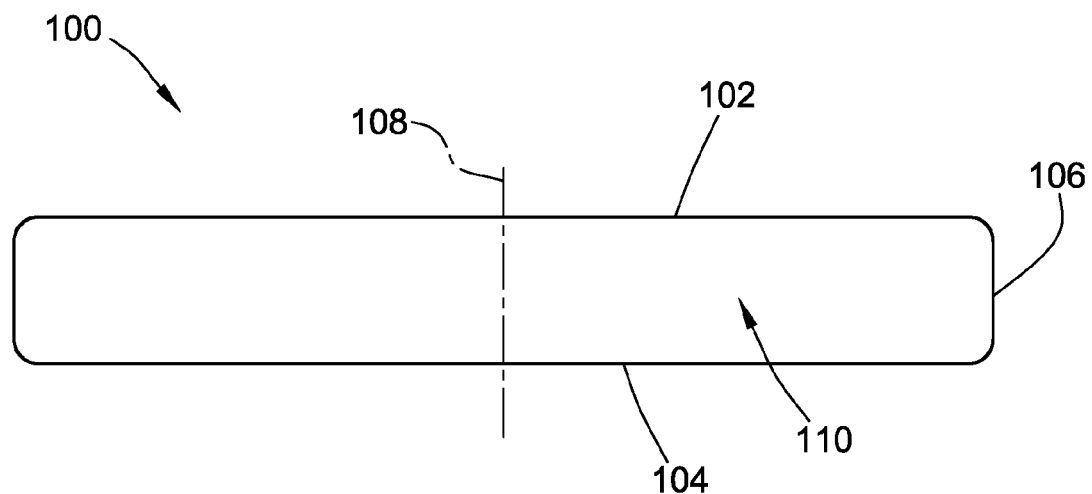
FIGS. 3A through 3H depict the process flow according to some embodiments of the present invention.

With reference to FIG. 3A, an exemplary, non-limiting single crystal semiconductor handle substrate 100 is depicted. In general, the single crystal semiconductor handle substrate 100 comprises two major, generally parallel surfaces 102, 104. One of the parallel surfaces is a front surface 102 of the single crystal semiconductor handle wafer 100, and the other parallel surface is a back surface 104 of the single crystal semiconductor handle substrate 100. The single crystal semiconductor handle substrate 100 comprises a circumferential edge 106 joining the front and back surfaces 102, 104. The single crystal semiconductor handle substrate 100 comprise a central axis 108 perpendicular to the two major, generally parallel surfaces 102, 104 and also perpendicular to a central plane defined by the points midway between the front and back surfaces 102, 104. The single crystal semiconductor handle substrate 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle substrate 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate 100, e.g., a single crystal silicon handle wafer, refers to the major surface of the substrate that becomes an interior surface of the bonded structure. Accordingly, a "back surface" of a single crystal semiconductor handle substrate 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10

PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have any of (100), (110), or (111) crystal orientation, and the choice of crystal orientation may be dictated by the end use of the structure.

Optionally, the front surface 102, the back surface 104, or both may be oxidized according to methods known in the art. Oxidation may be accomplished by means known in the art, such as thermal oxidation (in which some portion of the deposited semiconductor material film will be consumed), CVD oxide deposition, or by exposure to a standard cleaning solution, such as an SC1/SC2 cleaning solution. The oxidation layer on the front surface 102, the back surface 104, or both may be may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

II. Formation of a Cleave Plane in a High Resistivity Single Crystal Semiconductor Donor Substrate According to the method of the present invention, and with reference to FIGS. 3B and 3C, a single crystal semiconductor donor substrate 200 is prepared to have a cleave plane 230 suitable for producing a roughened surface layer in each of multiple multilayer structures prepared in parallel according to the method of the present invention.

Figure 3B:
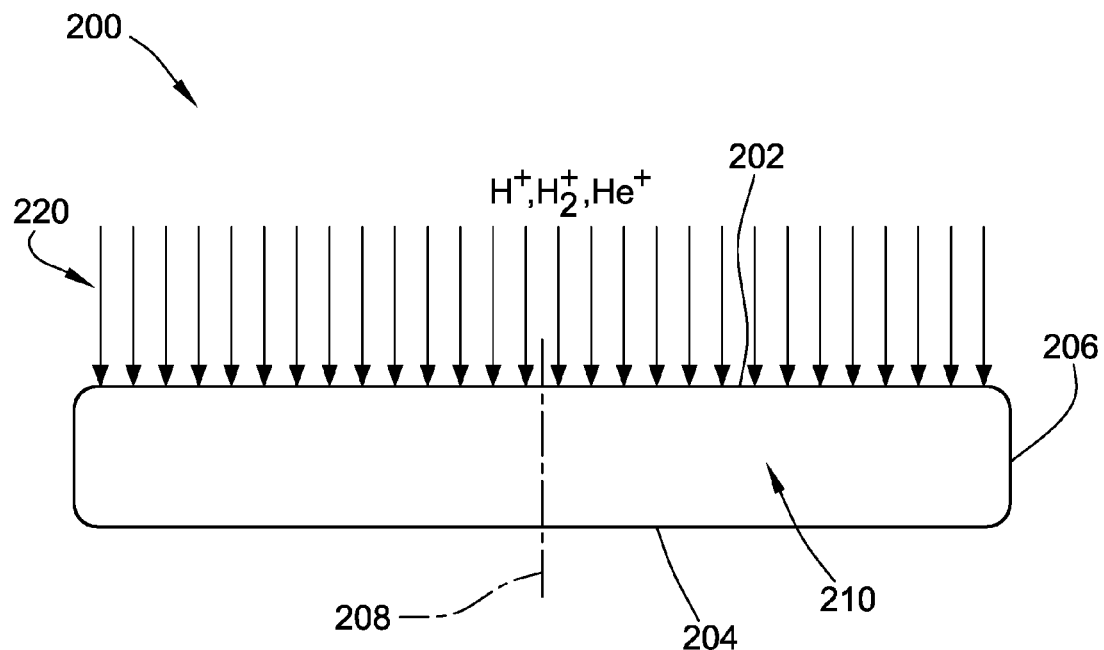

With reference to FIG. 3B, an exemplary, non-limiting single crystal semiconductor donor substrate 200 is depicted. In general, the single crystal semiconductor donor substrate 200 comprises two major, generally parallel surfaces 202, 204. One of the parallel surfaces is a front surface 202 of the single crystal semiconductor donor substrate 200, and the other parallel surface is a back surface 204 of single crystal semiconductor donor substrate 200. The single crystal semiconductor donor substrate 200 comprises a circumferential edge 206 joining the front and back surfaces 202, 204. The single crystal semiconductor donor substrate 200 comprise a central axis 208 perpendicular to the two major, generally parallel surfaces 202, 204 and also perpendicular to a central plane defined by the points midway between the front and back surfaces 202, 204. The single crystal semiconductor donor substrate 200 comprises a bulk region 210 between the two major, generally parallel surfaces 202, 204. Since semiconductor wafers, e.g., silicon wafers, typically have some total thickness variation (TTV), warp, and bow, the midpoint between every point on the front surface 202 and every point on the back surface 204 may not precisely fall within a plane. As a practical matter, however, the TTV, warp, and bow are typically so slight that to a close approximation the midpoints can be said to fall within an imaginary central plane which is approximately equidistant between the front and back surfaces.

In some embodiments, the single crystal semiconductor donor substrate 200 has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor donor substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

Figure 3C:
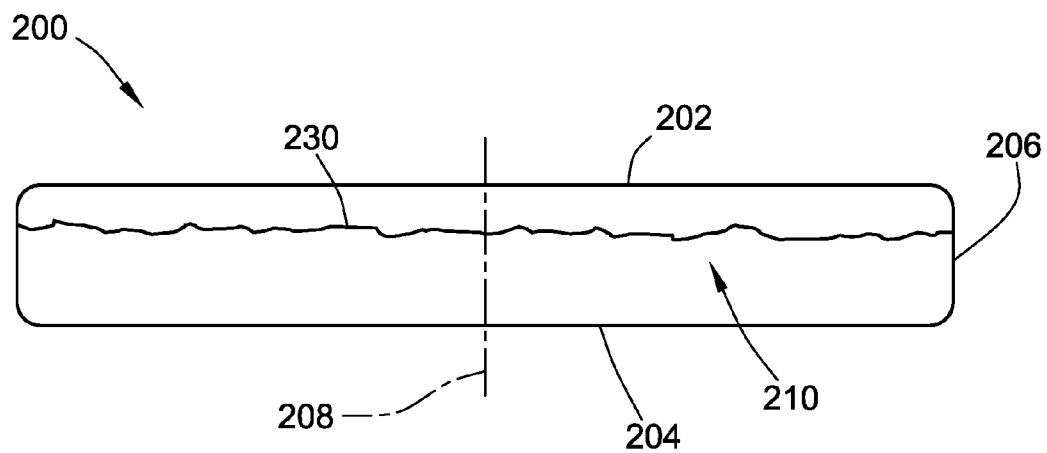

With reference to FIGS. 3B and 3C, ion implantation 220 through the front surface 202 of the single crystal semiconductor donor substrate 200 may be carried out in a commercially available instrument, such as an Applied Materials Quantum II, a Quantum LEAP, or a Quantum X. Implanted ions may include $He^+$, $H^+$, $H_2^+$, and any combination thereof. Ion implantation 220 is carried out at a density and duration sufficient to form a damage layer in the single crystal semiconductor handle substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The ions may be implanted to a depth between about 100 angstroms and about 20,000 angstroms, such as between about 1000 angstroms and about 3000 angstroms. In some embodiments it may be desirable to subject the ion implanted front surface 202 of the single crystal semiconductor donor substrate 200 to a clean after the implant. In some preferred embodiments, the clean could include a Piranha clean followed by a DI water rinse and SC1/SC2 cleans.

With reference to FIGS. 3B and 3C, after ion implantation 220, the implanted single crystal semiconductor donor substrate 200 is subjected to a thermal anneal to out-diffuse the implanted species and form a layer 230 of agglomerates. A conventional furnace, such as an ASM A 400, may be used for the thermal anneal. The temperature of the thermal anneal may range from about 300° C. to about 1200° C., such as between about 700° C. to about 1200° C. or between about 300° C. to about 450° C., and the duration may range from about 10 minutes to about 2 hours, such as between about 10 minutes and about 1 hour. Implantation 220 of $He^+$, $H^+$, $H_2^+$, and any combination thereof followed by heat treatment causes out-diffusion of the implanted species, which thereby forms a region or layer 230 of agglomerates. The layer 230 of agglomerates is generally a few nanometers thick, such as between 1 nanometer and about 1000 nanometers, or between about 10 nanometers and about 500 nanometers.

After ion implantation and thermal treatment, wafer cleaning is optional. If desired, the wafers can be cleaned, for example, in a standard SC1/SC2 solution.

The front surface 202, the back surface 204, or both of the single crystal semiconductor donor substrate 200 may be oxidized according to methods known in the art. Oxidation may be accomplished by means known in the art, such as thermal oxidation (in which some portion of the deposited semiconductor material film will be consumed) or CVD oxide deposition. Oxidation may be accomplished by means known in the art, such as thermal oxidation (in which some portion of the deposited semiconductor material film will be consumed) or CVD oxide deposition. In some embodiments, the single crystal semiconductor donor substrate 200, e.g., a single crystal silicon donor wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, the single crystal semiconductor donor substrate 200 may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. The oxidation layer on the front surface 202, the back surface 204, or both may be may be between about 1 nanometer and about 5000 nanometers thick, between about 10 nanometers and about 5000 nanometers thick, such as between about 100 nanometers and about 1000 nanometers, or between about 200 nanometers and about 400 nanometers, or between about 1 nanometer and about 100 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

III. Wafer to Wafer Bonding

Figure 3D:
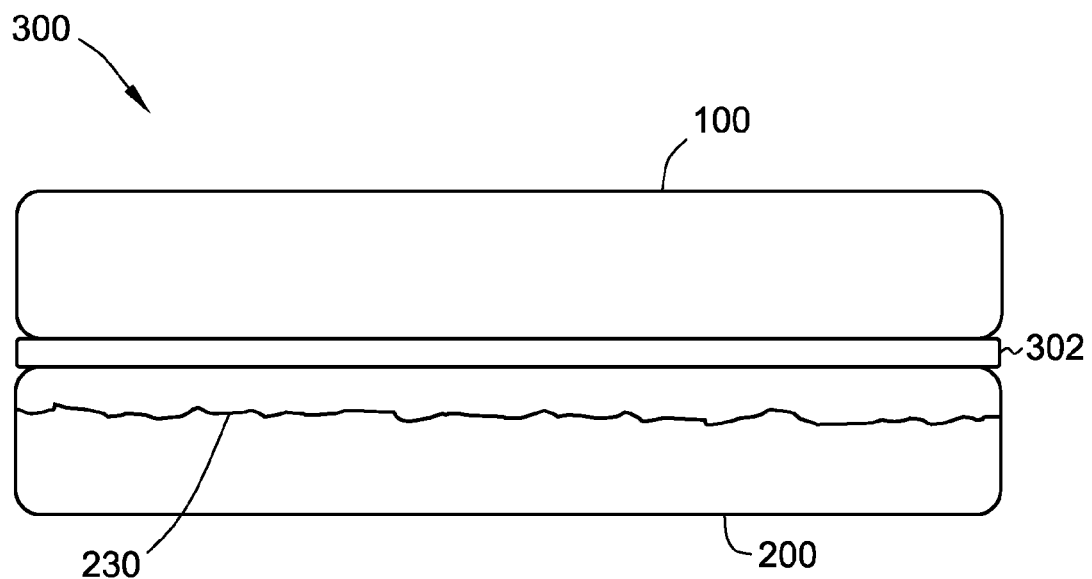

With reference to FIG. 3D, the front surface of the single crystal semiconductor donor substrate 200 comprising the layer 230 of agglomerates is bonded to the front surface of the single crystal semiconductor handle substrate 100 to thereby form an initial bonded structure 300. The layer of agglomerates is suitable for use as an initial cleave plane 230. Since one or both of the front surfaces of the single crystal semiconductor donor substrate 200 and the single crystal semiconductor handle substrate 100 is oxidized, the initial bonded structure 300 comprises a dielectric layer 302. That is, the dielectric layer 302 may comprise contributions from one or more oxidation layers present on the front surfaces of the single crystal semiconductor donor substrate 200 and the single crystal semiconductor handle substrate 100. The initial bonded structure 300 is suitable for preparing multiple multilayer structures in parallel. The initial bonded structure 300 comprises an initial single crystal semiconductor handle substrate 100, an initial dielectric layer 302 in contact with a front surface of the initial single crystal semiconductor handle substrate 100, and an initial single crystal semiconductor donor substrate 200 in contact with the initial dielectric layer, wherein the initial single crystal semiconductor donor substrate 200 has a minimum bulk region resistivity of at least about 500 ohm-cm and further wherein the initial single crystal semiconductor donor substrate 200 comprises an initial cleave plane 230. In some embodiments, the minimum bulk resistivity of the initial single crystal semiconductor donor substrate 200 is at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000

Ohm-cm. In some preferred embodiments, the single crystal semiconductor donor substrate has a bulk resistivity between about 1000 Ohm-cm and about 6,000 Ohm-cm.

In some embodiments, the front surface of the initial single crystal semiconductor donor substrate 200 comprising the initial cleave plane 230 is subjected to oxygen plasma and/or nitrogen plasma surface activation prior to bonding. In some embodiments, the oxygen plasma surface activation tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The ion-implanted and optionally cleaned initial single crystal semiconductor donor substrate 200 comprising the initial cleave plane 230 is loaded into the chamber. The chamber is evacuated and backfilled with $O_2$ to a pressure less than atmospheric to thereby create the plasma. The single crystal semiconductor donor substrate 200 is exposed to this plasma for the desired time, which may range from about 1 second to about 120 seconds. Oxygen plasma surface oxidation is performed in order to render the front surface of the initial single crystal semiconductor donor substrate 200 hydrophilic and amenable to bonding to the initial single crystal semiconductor handle substrate 100.

The hydrophilic front surface layer of the initial single crystal semiconductor donor substrate 200 and the front surface of the single crystal semiconductor handle substrate 100 are next brought into intimate contact to thereby form an initial bonded structure 300. The bonded structure comprises a dielectric layer 302, e.g., a buried oxide such as silicon oxide. In some embodiments, the dielectric layer 302 comprises a buried oxide layer, such as a silicon oxide layer, having a thickness of at least about 10 nanometer thick, such as between about 10 nanometers and about 10,000 nanometers, between about 10 nanometers and about 5,000 nanometers, or between about 100 nanometers and about 400 nanometers.

Since the mechanical bond is relatively weak, the bonded structure 300 is further annealed to solidify the bond between the single crystal semiconductor donor substrate 200 and the single crystal semiconductor handle substrate 100. In some embodiments of the present invention, the bonded structure 300 is annealed to strengthen the bond. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours.

IV. Cleaving the Initial Bonded Structure

Figure 3E:
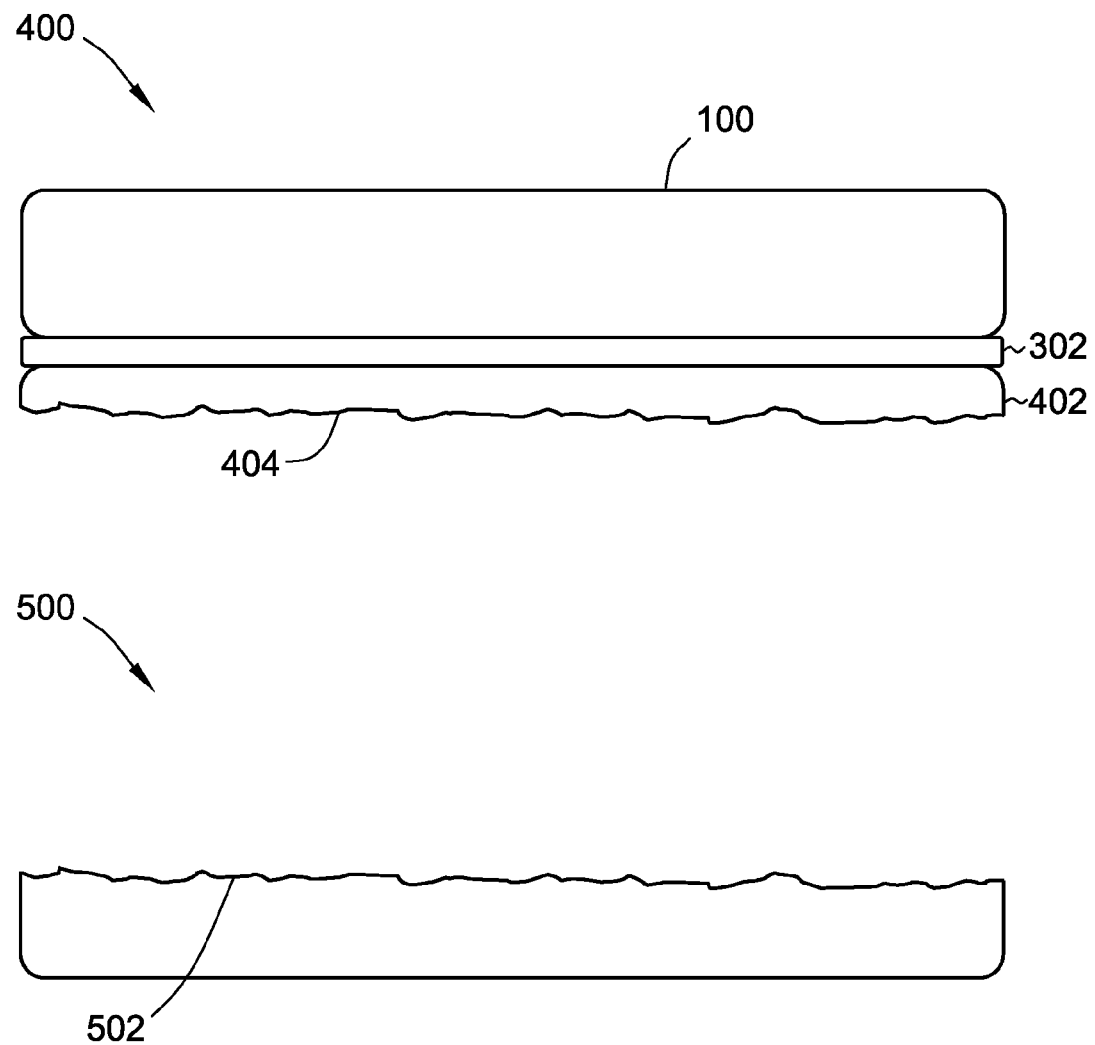

With reference to FIG. 3E, after the thermal anneal, the initial bonded structure 300 is mechanically cleaved at the initial cleave plane 230 to thereby prepare an initial cleaved structure 400 and a second single crystal semiconductor handle substrate 500. The initial cleaved structure 400 comprises the initial single crystal semiconductor handle substrate 100, the initial dielectric layer 302 in contact with the front surface of the initial single crystal semiconductor handle substrate 100, and a first single crystal semiconductor device layer 402 in contact with the initial dielectric layer 302. As illustrated in FIG. 3E, the initial cleaved structure 400 comprises a roughened front surface 404 having a surface roughness of at least about 0.01 micrometers, at least about 0.1 micrometers, such as between about 0.1 micrometer and about 1 micrometer, as measured according to the root mean square method over a surface area of at least 30 micrometers by 30 micrometers. In some embodiments, the first single crystal semiconductor device layer 402 has a minimum bulk region resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor device layer 402 has a bulk resistivity between about 1000 Ohm-cm and about 6,000 Ohm-cm.

The second single crystal semiconductor handle substrate 500 has a minimum bulk region resistivity of at least about 500 ohm-cm and has a roughened front surface 502 having a surface roughness of at least about 0.01 micrometers, at least about 0.1 micrometers, such as between about 0.1 micrometer and about 1 micrometer, as measured according to the root mean square method over a surface area of at least 30 micrometers by 30 micrometers. In some embodiments, the second single crystal semiconductor handle substrate 500 has a resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate 500 has a bulk resistivity between about 1000 Ohm-cm and about 6,000 Ohm-cm.

The root mean squared is calculated according to the following equation:

$$R_q = \sqrt{\frac{1}{n}\sum_{i=1}^{n} y_i^2}$$

The roughness profile contains ordered, equally spaced points along the trace, and y, is the vertical distance from the mean line to the data point. Roughness is measured over a 30 micrometer by 30 micrometer surface area.

Cleaving may occur according to techniques known in the art. In some embodiments, the initial bonded structure 300 may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes separates the initial cleaved structure 400 from the second single crystal semiconductor handle substrate 500. See FIG. 3E.

After cleaving, wafer cleaning is optional. If desired, the initial cleaved structure 400 and/or the second single crystal semiconductor handle substrate 500 can be cleaned, for example, in a standard SC1/SC2 solution. In some embodiments, the roughened front surfaces of the initial cleaved structure 400 and/or the second single crystal semiconductor handle substrate 500 can be smoothed.

In some embodiments, the roughened front surfaces of the initial cleaved structure 400 and/or the second single crystal semiconductor handle substrate 500 can be oxidized. Oxidation may be accomplished by means known in the art, such as thermal oxidation (in which some portion of the deposited semiconductor material film will be consumed) or CVD oxide deposition. In some embodiments, the single crystal semiconductor handle substrate, e.g., a single crystal silicon handle wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, the initial cleaved structure 400 and/or the second single crystal semiconductor handle substrate 500 may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. The oxidation layer on the roughened front surface(s) may be between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

V. Deposition of Charge Trapping Layers in Parallel

Figure 3F:
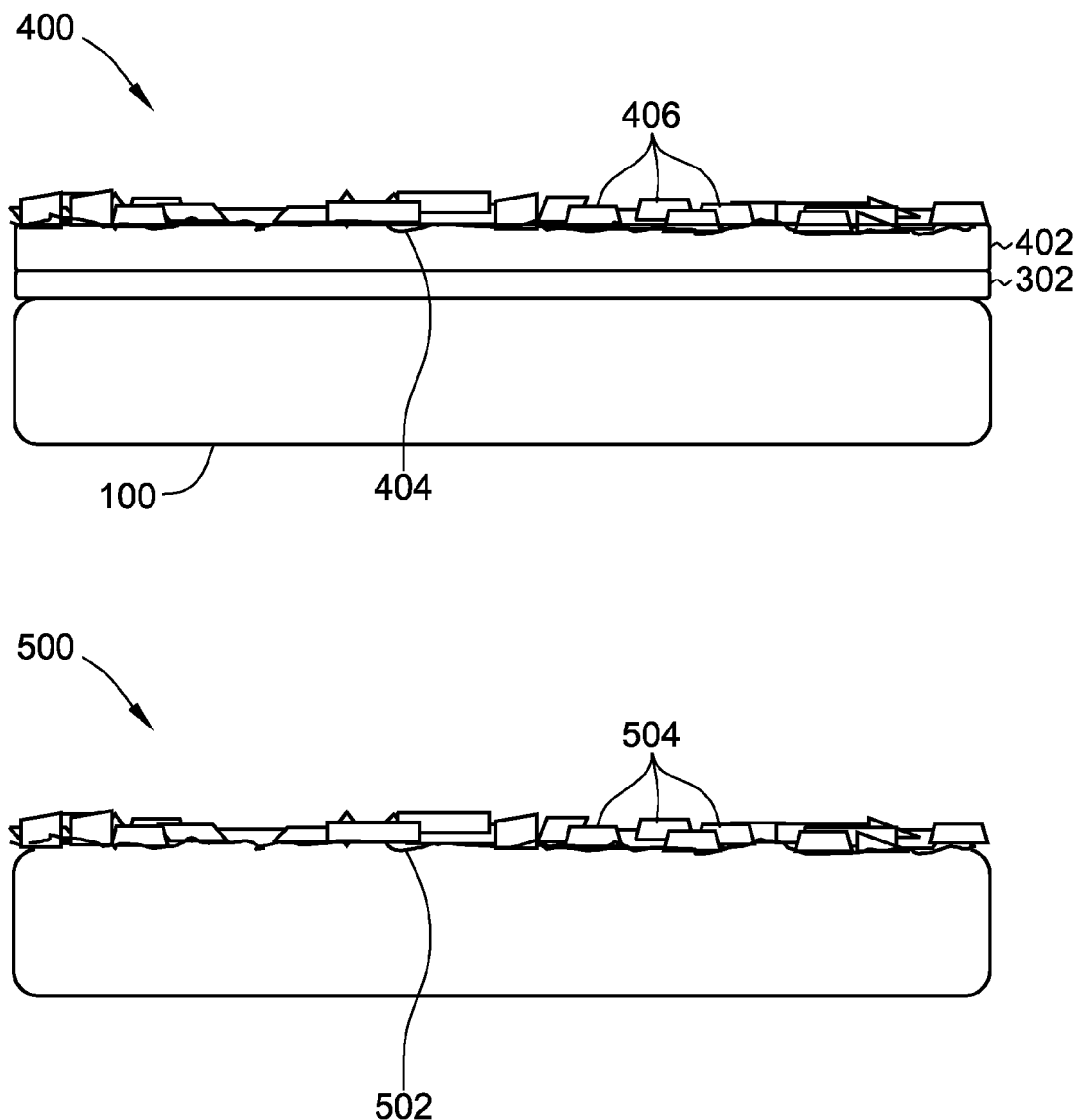

According to the method of the present invention and with reference to FIG. 3F, semiconductor material is deposited onto the roughened front surface 404 on the first single crystal semiconductor device layer 402 of the initial cleaved structure 400 and the roughened front surface 502 of the second single crystal semiconductor handle substrate 500. The semiconductor material deposited is suitable for use in forming a first charge trapping layer 406 on the roughened front surface 404 on the first single crystal semiconductor device layer 402 of the initial cleaved structure 400. The semiconductor material deposited is suitable for use in forming a second charge trapping layer 504 on the roughened front surface 502 of the second single crystal semiconductor handle substrate 500.

Materials suitable for use in depositing the first charge trapping layer 406 and the second charge trapping layer 504 include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline semiconductor, e.g., polycrystalline silicon, denotes a material comprising small silicon crystals having random crystal orientations. Polycrystalline silicon grains may be as small in size as about 20 nanometers. The polycrystalline silicon grains may be as large as 1000 nanometers. In some embodiments, the polycrystalline silicon grains may have an average size between about 20 nanometers and about 500 nanometers. According to the method of the present invention, the smaller the crystal grain size of polycrystalline silicon deposited the higher the defectivity in the charge trapping layers. Amorphous semiconductor, e.g., amorphous silicon, comprises a non-crystalline allotropic form of silicon, which lacks short range and long range order. Silicon grains having crystallinity over no more than about 10 nanometers may also be considered essentially amorphous. Silicon germanium comprises an alloy of silicon germanium in any molar ratio of silicon and germanium. Silicon doped with carbon comprises a compound of silicon and carbon, which may vary in molar ratio of silicon and carbon. Preferably, the first charge trapping layer 406 and the second charge trapping layer 504 have a resistivity at least about 1000 Ohm-cm, or at least about 3000 Ohm-cm, such as between about 1000 Ohm-cm and about 100,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm.

The material for use in preparing the first charge trapping layer 406 and the second charge trapping layer 504 may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% on an atomic basis and about 10% on an atomic basis. The overall thicknesses of the first charge trapping layer 406 and the second charge trapping layer 504 may be between about 0.3 micrometers and about 5 micrometers, such as between about 0.3 micrometers and about 3 micrometers, such as between about 0.3 micrometers and about 2 micrometers or between about 2 micrometers and about 3 micrometers.

Due to the roughness of the roughened front surface 404 on the first single crystal semiconductor device layer 402 of the initial cleaved structure 400 and the roughened front surface 502 of the second single crystal semiconductor handle substrate 500, the first charge trapping layer 406 and the second charge trapping layer 504 comprising polycrystalline silicon and/or the other materials comprises grains having a plurality of orientations. Moreover, the grains may be randomly oriented. See FIG. 3F, which depicts an exemplary, non-limiting illustration of the polycrystalline silicon grains having a plurality of shapes, sizes, and orientations in the first charge trapping layer 406 and the second charge trapping layer 504. The depiction of FIG. 3F is meant to be illustrative of random orientation of crystalline grains. In some embodiments, the plurality of crystal orientations of the polycrystalline silicon comprising grains comprise at least two orientations selected from the group consisting of (111), (100), and (110). The random orientations, sizes, and shapes enhance the defectivity and effectiveness of the charge trapping layer. The grain size can be measured by x-ray diffraction, raman spectroscopy, atomic force microscopy, and other techniques for surface measurement. The typical grain size may range from between about 10 nanometers to about 3 micrometers, such as between about 10 nanometers and about 1 micrometer, or between about 1 micrometer and about 2 micrometers. These grain sizes are suitable for the purpose of trapping charge. Uniform grain size across the charge trapping layer is preferred rather than a wide distribution of grain sizes.

In some embodiments, the first charge trapping layer 406 and the second charge trapping layer 504 comprising polycrystalline silicon and/or the other materials disclosed herein may be subjected to chemical mechanical polishing ("CMP"). Chemical mechanical polishing may occur by methods known in the art. The post-CMP roughness, as measured by AFM, is preferably less than about 0.5 nanometers (root mean square), preferably between about 0.1 nanometer and about 0.3 nanometer. This roughness is advantageous for the subsequent successful bonding to the donor substrate and layer transfer.

In some embodiments, the first charge trapping layer 406 and/or the second charge trapping layer 504 is, optionally, oxidized. Oxidizing is optional and generally depends upon the requirements of the final semiconductor on insulator structure. Oxidation may be accomplished by means known in the art, such as thermal oxidation (in which some portion of the deposited semiconductor material film will be consumed) or CVD oxide deposition. In some embodiments, the first charge trapping layer 406 and/or the second charge trapping layer 504 may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, the initial cleaved structure 400 and/or the second single crystal semiconductor handle substrate 500 may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. The oxidation layer on the first charge trapping layer 406 and/or the second charge trapping layer 504 may be between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Wafer cleaning is optional. If desired, the initial cleaved structure 400 and/or the second single crystal semiconductor handle substrate 500 can be cleaned, for example, in a standard SC1/SC2 solution.

VI. Preparation of Bonded, Multilayer Structures in Parallel

Figure 3G:
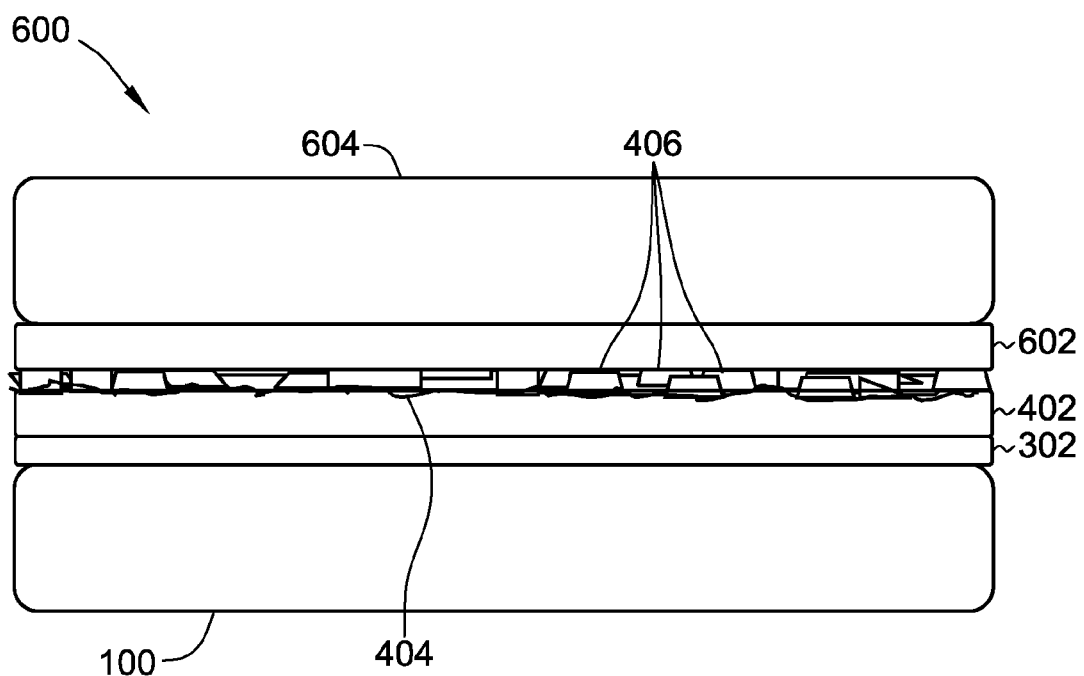
Figure 3G:
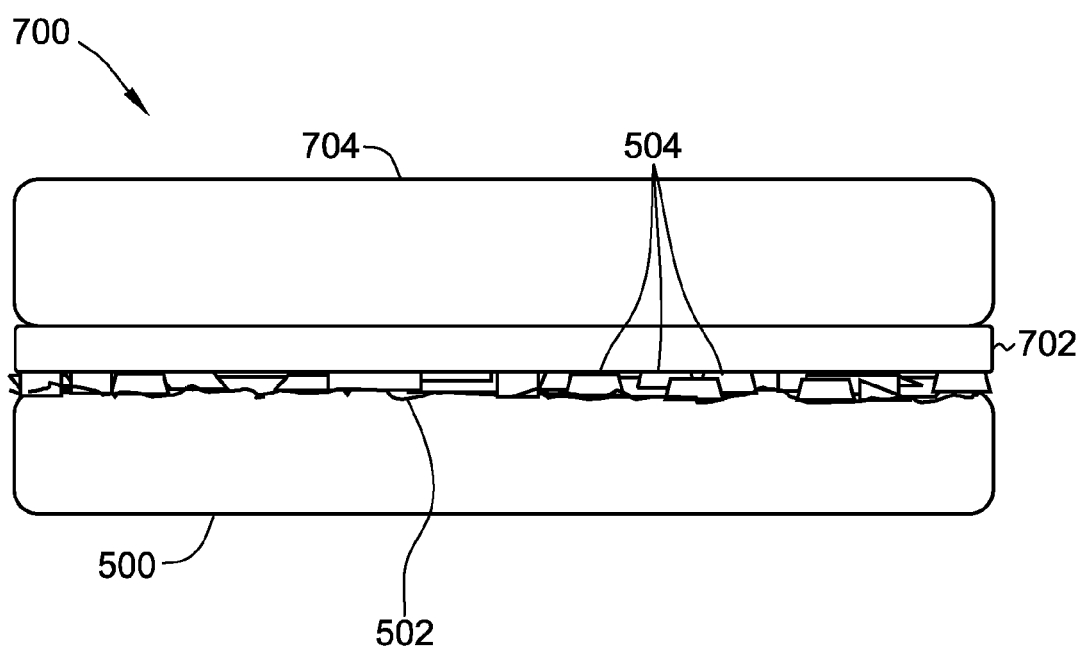

With reference to FIGS. 3F and 3G, two bonded, multilayer structures 600 and 700 may be prepared in parallel using the initial cleaved structure 400 and the second single crystal semiconductor handle substrate 500, each of which comprises a charge trapping layer, 406 and 504.

The first multilayer structure 600 comprises the initial single crystal semiconductor handle substrate 100, the initial dielectric layer 302 in contact with the front surface of the initial single crystal semiconductor handle substrate 100, the first single crystal semiconductor device layer 402 in contact with the initial dielectric layer 302, the first charge trapping layer 406 in contact with the roughened front surface 404 of the first single crystal semiconductor device layer 402, a first dielectric layer 602 in contact with the first charge trapping layer 406, and a first single crystal semiconductor donor substrate 604 in contact with the first dielectric layer 602. The first single crystal semiconductor device layer 402 has a minimum bulk region resistivity of at least about 500 ohm-cm and has a roughened front surface having a surface roughness of at least about 0.1 micrometers as measured according to the root mean square method over a surface area of at least 30 micrometers by 30 micrometers. In some embodiments, the first single crystal semiconductor device layer 402 has a minimum bulk region resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the semiconductor device layer 402 has a bulk resistivity between about 1000 Ohm-cm and about 6,000 Ohm-cm.

The first multilayer structure 600 may be prepared by bonding the first charge trapping layer 406 in contact with the roughened front surface of the first single crystal semiconductor device layer 402 to a single crystal semiconductor donor substrate 604, e.g., a single crystal semiconductor donor wafer, which is prepared according to conventional layer transfer methods. The single crystal semiconductor donor substrate 604 may be a single crystal semiconductor wafer. In preferred embodiments, the single crystal semiconductor donor substrate 604 comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor donor substrate 604 may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor substrate 604 may be subjected to standard process steps including oxidation, implant, and post implant cleaning. Accordingly, a single crystal semiconductor donor substrate 604, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the single crystal semiconductor donor substrate 604 comprises a dielectric layer 602. Suitable dielectric layers may comprise a material selected from among silicon dioxide, silicon nitride, hafnium oxide, titanium oxide, zirconium oxide, lanthanum oxide, barium oxide, and a combination thereof. In some embodiments, the dielectric layer 602 comprises an oxide layer having a thickness of at least about 10 nanometer thick, such as between about 10 nanometers and about 10,000 nanometers, between about 10 nanometers and about 5,000 nanometers, or between about 100 nanometers and about 400 nanometers.

The second multilayer structure 700 comprises the second single crystal semiconductor handle substrate 500, the second charge trapping layer 504 in contact with the roughened front surface 502 of the second single crystal semiconductor handle substrate 500, a second dielectric layer 702 in contact with the second charge trapping layer 504, and a second single crystal semiconductor donor substrate 704 in contact with the second dielectric layer. The second single crystal semiconductor handle substrate 500 has a minimum bulk region resistivity of at least about 500 ohm-cm and has a roughened front surface having a surface roughness of at least about 0.1 micrometers as measured according to the root mean square method over a surface area of at least 30 micrometers by 30 micrometers. In some embodiments, the second single crystal semiconductor handle substrate 500 has a resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the semiconductor handle substrate 500 has a bulk resistivity between about 1000 Ohm-cm and about 6,000 Ohm-cm.

The second multilayer structure 700 may be prepared by bonding the second charge trapping layer 504 in contact with the roughened front surface 502 of the second single crystal semiconductor handle substrate 500 to a single crystal semiconductor donor substrate 704, e.g., a single crystal semiconductor donor wafer, which is prepared according to conventional layer transfer methods. The single crystal semiconductor donor substrate 704 may be a single crystal semiconductor wafer. In preferred embodiments, the single crystal semiconductor donor substrate 704 comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor donor substrate 604 may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor substrate 704 may be subjected to standard process steps including oxidation, implant, and post implant cleaning. Accordingly, a single crystal semiconductor donor substrate 704, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the single crystal semiconductor donor substrate 704 comprises a dielectric layer 702. Suitable dielectric layers may comprise a material selected from among silicon dioxide, silicon nitride, hafnium oxide, titanium oxide, zirconium oxide, lanthanum oxide, barium oxide, and a combination thereof. In some embodiments, the dielectric layer 702 comprises an oxide layer having a thickness of at least about 10 nanometer thick, such as between about 10 nanometers and about 10,000 nanometers, between about 10 nanometers and about 5,000 nanometers, or between about 100 nanometers and about 400 nanometers.

In some embodiments, the front surfaces of the single crystal semiconductor donor substrates 604 and 704 (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surfaces of the single crystal semiconductor donor substrates 604 and 704 may be thermally oxidized in a furnace such as an ASM A400 in the same manner described above. In some embodiments, the single crystal semiconductor donor substrates 604 and 704 are oxidized to provide an oxide layer on the front surface layer of at least about 10 nanometer thick, such as between about 10 nanometers and about 10,000 nanometers, between about 10 nanometers and about 5,000 nanometers, or between about 100 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Ion implantation of the single crystal semiconductor donor substrates 604 and 704 to form a cleave plane may be carried out in a commercially available instrument, such as an Applied Materials Quantum II, a Quantum LEAP, or a Quantum X. Implanted ions may include $He^+$, $H^+$, $H_2^+$, and any combination thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The ions may be implanted to a depth between about 100 angstroms and about 20,000 angstroms, such as between about 1000 angstroms and about 3000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrates 604 and 704 having ion implant regions therein formed by helium ion and/or hydrogen ion implant is annealed at a temperature sufficient to form a thermally activated cleave plane in the single crystal semiconductor donor substrates 604 and 704. An example of a suitable tool might be a simple Box furnace, such as a Blue M model. In some preferred embodiments, the ion implanted single crystal semiconductor donor substrates 604 and 704 are annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surfaces are preferably cleaned.

In some embodiments, the ion-implanted and optionally cleaned and optionally annealed single crystal semiconductor donor substrates 604 and 704 are subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor substrates 604 and 704 are loaded into the chamber. The chamber is evacuated and backfilled with $O_2$ to a pressure less than atmospheric to thereby create the plasma. The single crystal semiconductor donor substrates 604 and 704 are exposed to this plasma for the desired time, which may range from about 1 second to about 120 seconds. Oxygen plasma surface oxidation is performed in order to render the front surfaces of the single crystal semiconductor donor substrates 604 and 704 hydrophilic and amenable to bonding to structures prepared according to the method described above.

To prepare the first multilayer structure 600, the hydrophilic front surface of the single crystal semiconductor donor substrate 604 is brought into contact with the first charge trapping layer 406 in contact with the roughened front surface 404 of the first single crystal semiconductor device layer 402. To prepare the second multilayer structure 700, the hydrophilic front surface of the single crystal semiconductor donor substrate 704 is brought into contact with the second charge trapping layer 504 in contact with the roughened front surface of the second single crystal semiconductor handle substrate 500. The multilayer structures 600 and 700 comprise dielectric layers 602 and 702, e.g., a buried oxide such as silicon oxide. In some embodiments, the dielectric layers 602 and 702 comprise buried oxide layers, such as silicon oxide layers, having a thickness of at least about 10 nanometer thick, such as between about 10 nanometers and about 10,000 nanometers, between about 10 nanometers and about 5,000 nanometers, or between about 100 nanometers and about 400 nanometers.

Since the mechanical bond is relatively weak, the first multilayer structure 600 and/or the second multilayer structure 700 are further annealed to solidify the bonds between the charge trapping layers 406, 504 and the dielectric layers 602, 702. In some embodiments of the present invention, the first multilayer structure 600 and/or the second multilayer structure 700 are annealed at a temperature sufficient to form a thermally activated cleave plane in the single crystal semiconductor donor substrates 604, 704. An example of a suitable tool might be a simple Box furnace, such as a Blue M model. In some preferred embodiments, the first multilayer structure 600 and the second multilayer structure 700 are annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the first multilayer structure 600 and the second multilayer structure 700 may be cleaved.

After the thermal anneal, the first multilayer structure 600 and the second multilayer structure 700 are subjected to layer transfer via cleaving the bonded structures at the cleave planes in the single crystal semiconductor donor substrates 604, 704. Cleaving may occur according to techniques known in the art. In some embodiments, the first multilayer structure 600 and/or the second multilayer structure 700 may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the single crystal semiconductor donor substrates 604, 704, thereby leaving single crystal semiconductor device layers 606, 706 preferably a silicon device layer, on the semiconductor-on-insulator composite structures. See FIG. 3H.

After cleaving, the first cleaved multilayer structure 600 and/or the second cleaved multilayer structure 700 may be subjected to a high temperature anneal in order to further strengthen the bond between the transferred device single crystal semiconductor device layers 606, 706 and the single crystal semiconductor handle substrates. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred single crystal semiconductor device layers 606, 706 and the single crystal semiconductor handle substrates.

After the cleave and high temperature anneal, the first cleaved multilayer structure 600 and/or the second cleaved multilayer structure 700 may be subjected to a cleaning process designed to remove thin thermal oxide and clean particulates from the surface. In some embodiments, the single crystal semiconductor device layers 606, 706 may be brought to the desired thickness and smoothness by subjecting to a vapor phase HCl etch process in a horizontal flow single wafer epitaxial reactor using $H_2$ as a carrier gas. In some embodiments, the single crystal semiconductor device layers 606, 706 may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, an epitaxial layer may be deposited on one or both of the transferred single crystal semiconductor device layers 606, 706. A deposited epitaxial layer may comprise substantially the same electrical characteristics as the underlying single crystal semiconductor device layers 606, 706. Alternatively, the epitaxial layer may comprise different electrical characteristics as the underlying single crystal semiconductor device layers 606, 706. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from the group consisting of boron, arsenic, and phosphorus. The resistivity of the epitaxial layer may range from 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

Figure 3H:
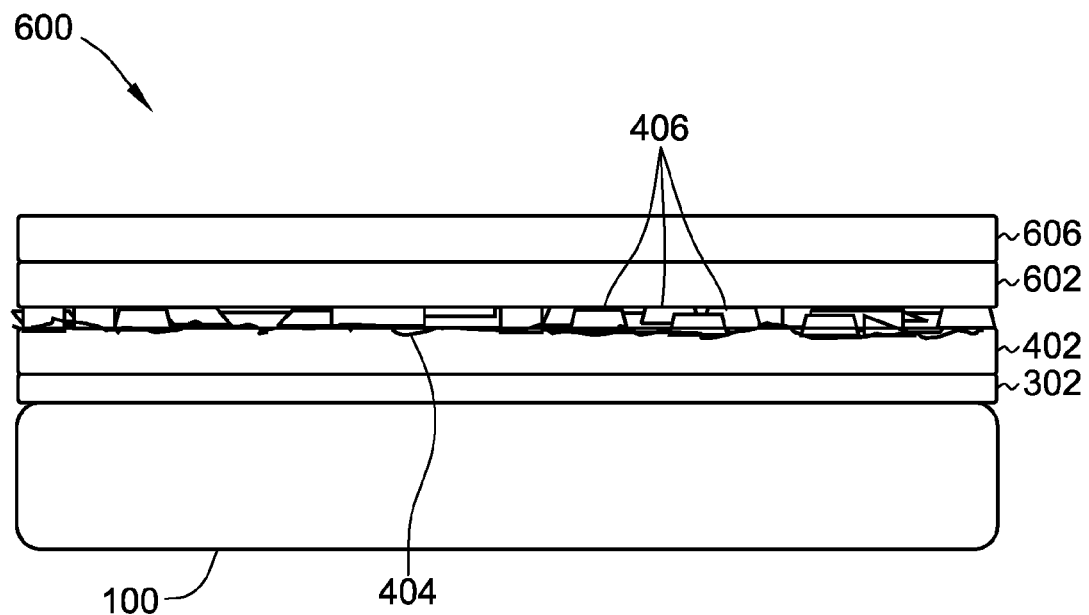
Figure 3H:
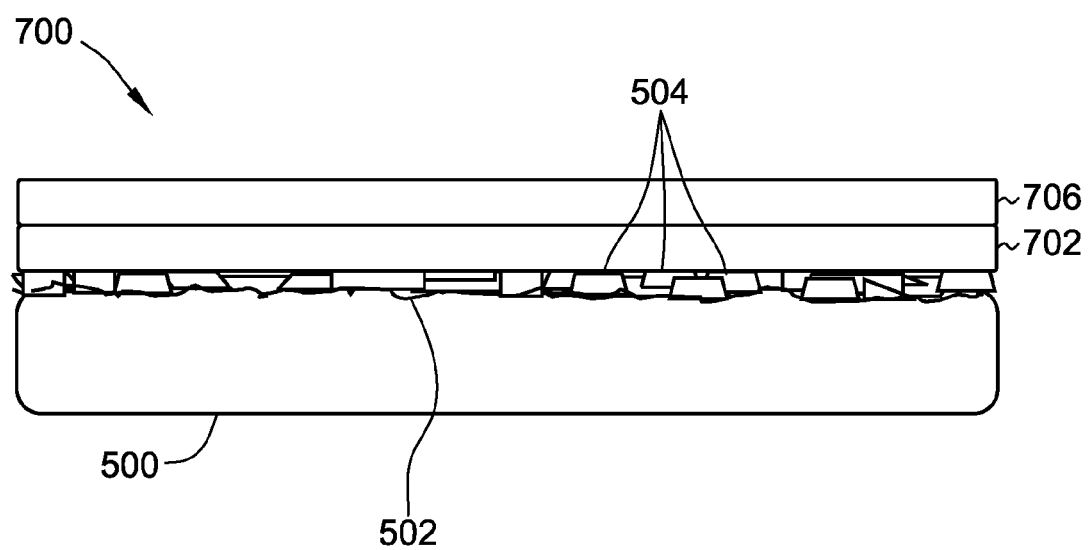

According to the process of the present invention, multiple multilayer structures may be prepared in parallel. With reference to FIG. 3H, a first cleaved structure 600 may be prepared comprising the initial single crystal semiconductor handle substrate 100, the initial dielectric layer 302 in contact with the front surface of the initial single crystal semiconductor handle substrate 100, the first single crystal semiconductor device layer 402 in contact with the initial dielectric layer 302, the first charge trapping layer 406 in contact with the roughened front surface 404 of the first single crystal semiconductor device layer 402, the first dielectric layer 602 in contact with the first charge trapping layer 406, and a first single crystal semiconductor device layer 606. The first single crystal semiconductor device layer 402 has a minimum bulk region resistivity of at least about 500 ohm-cm and has a roughened front surface having a surface roughness of at least about 0.1 micrometers as measured according to the root mean square method over a surface area of at least 30 micrometers by 30 micrometers. In some embodiments, the first single crystal semiconductor device layer 402 has a resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the semiconductor device layer 402 has a bulk resistivity between about 1000 Ohm-cm and about 6,000 Ohm-cm. The resistivity of the first single crystal semiconductor device layer 606 may range from 1 to 50 Ohm-cm, typically, from 5 to 25 Ohm-cm.

Again, with reference to FIG. 3H, a second cleaved structure 700 comprising the second single crystal semiconductor handle substrate 500, the second charge trapping layer 504 in contact with the roughened front surface 502 of the second single crystal semiconductor handle substrate 500, the second dielectric layer 702 in contact with the second charge trapping layer 504, and a second single crystal semiconductor device layer 706. The second single crystal semiconductor handle substrate 500 has a minimum bulk region resistivity of at least about 500 ohm-cm and has a roughened front surface having a surface roughness of at least about 0.1 micrometers as measured according to the root mean square method over a surface area of at least 30 micrometers by 30 micrometers. In some embodiments, the second single crystal semiconductor handle substrate 500 has a resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the semiconductor handle substrate 500 has a bulk resistivity between about 1000 Ohm-cm and about 6,000 Ohm-cm. The resistivity of the second single crystal semiconductor device layer 706 may range from 1 to 50 Ohm-cm, typically, from 5 to 25 Ohm-cm.

The finished multilayer structures may then be subjected to end of line metrology inspections and cleaned a final time using typical SC1-SC2 process.

One or both of first cleaved structure 600 and the second cleaved structure 700 may be suitable for use in integrated circuit device manufacture.

Figure 4:
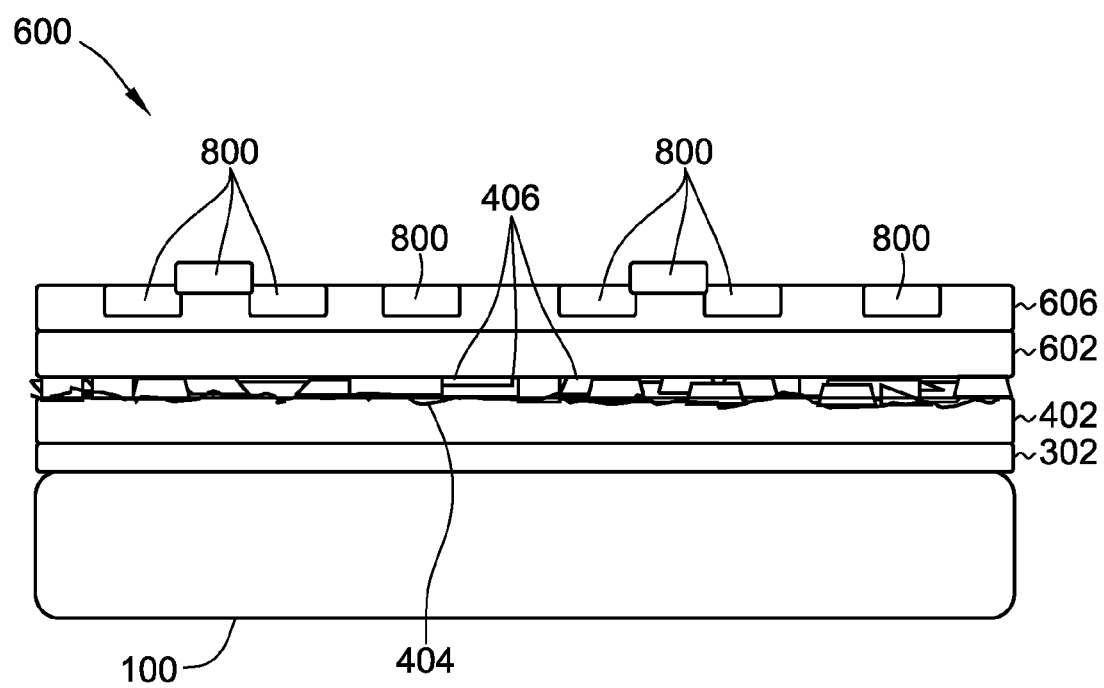
FIG. 4 is a depiction of a multilayer structure according to some embodiments of the present invention.

For example, with reference to FIG. 4, the first cleaved multilayer structure 600 may be subjected to front end of the line (FEOL) modification and back end of the line manufacture (BEOL). The first cleaved multilayer structure 600 comprises a single crystal semiconductor handle substrate 100 comprising two major, generally parallel surfaces, one of which is a front surface of the single crystal semiconductor handle substrate 100 and the other of which is a back surface of the single crystal semiconductor handle substrate 100; a handle dielectric layer 302 in interfacial contact with the front surface of the single crystal semiconductor handle substrate 100; a high resistivity single crystal semiconductor layer 402 in interfacial contact with the dielectric layer 302, wherein the high resistivity single crystal semiconductor layer 402 has a minimum bulk resistivity of at least about 500 ohm-cm and further comprises a roughened front surface 404 having a surface roughness of at least about 0.1 micrometers as measured according to the root mean square method over a surface area of at least 30 micrometers by 30 micrometers; a charge trapping layer 406 in interfacial contact with the roughened front surface 404 of the high resistivity single crystal semiconductor layer 402, the charge trapping layer 406 comprising polycrystalline silicon, the polycrystalline silicon comprising grains having a plurality of crystal orientations; a device dielectric layer 602 in interfacial contact with the charge trapping layer 406, and a first single crystal semiconductor device layer 606.

The first single crystal semiconductor device layer 606 of the first cleaved multilayer structure 600 is subjected to front end of the line (FEOL) modification comprising devices 800. Suitable devices 800 include transistors, capacitors, resistors, etc., chosen according to the demands of the final integrated circuit device. FEOL contains all processes of CMOS fabrication needed to form fully isolated CMOS elements: Selecting the type of wafer to be used; Chemical-mechanical planarization and cleaning of the wafer; Shallow trench isolation (STI) (or LOCOS in early processes, with feature size>0.25 μm); Well formation; Gate module formation; and Source and drain module formation.

Front end of the line manufacture is followed by back end of the line manufacture (BEOL), where the individual devices 800 (transistors, capacitors, resistors, etc.) get interconnected with wiring on the wafer. BEOL generally begins when the first layer of metal is deposited on the wafer. BEOL includes contacts, insulating layers (dielectrics), metal levels, and bonding sites for chip-to-package connections. After the last FEOL step, there is a wafer with isolated transistors (without any wires). In BEOL part of fabrication stage contacts (pads), interconnect wires, vias, and dielectric structures are formed. For modern IC process, more than 10 metal layers can be added in the BEOL.

Figure 5:
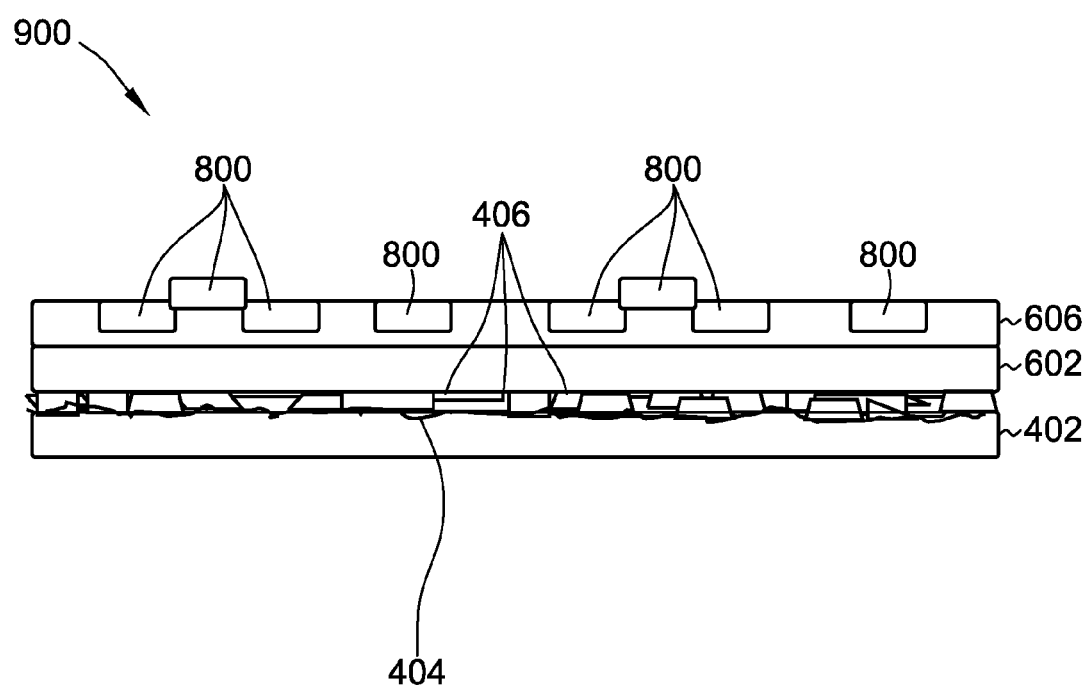
FIG. 5 is a depiction of a multilayer structure according to some embodiments of the present invention.

The multilayer structure may be suitable for use as depicted in FIG. 4. Alternatively, the initial single crystal semiconductor handle substrate 100 and the initial dielectric layer 302 in contact with the front surface of the initial single crystal semiconductor handle substrate 100 may be removed by means known in the art, such as etching. Removing the initial single crystal semiconductor handle substrate 100 and the initial dielectric layer 302 results in a multilayer structure 900 depicted in FIG. 5. The multilayer structure 900 comprises a high resistivity single crystal semiconductor layer 402, wherein the high resistivity single crystal semiconductor layer 402 has a minimum bulk resistivity of at least about 500 ohm-cm and further comprises a roughened front surface 404 having a surface roughness of at least about 0.1 micrometers as measured according to the root mean square method over a surface area of at least 30 micrometers by 30 micrometers; a charge trapping layer 406 in interfacial contact with the roughened front surface 404 of the high resistivity single crystal semiconductor layer 402, the charge trapping layer 406 comprising polycrystalline silicon, the polycrystalline silicon comprising grains having a plurality of crystal orientations; a device dielectric layer 602 in interfacial contact with the charge trapping layer 406, and a single crystal semiconductor device layer 606 in interfacial contact with the donor dielectric layer, wherein the single crystal semiconductor device layer comprises electronic circuits 800. In some embodiments, the high resistivity single crystal semiconductor layer 402 has a resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the semiconductor device layer 402 has a bulk resistivity between about 1000 Ohm-cm and about 6,000 Ohm-cm. The resistivity of the single crystal semiconductor device layer 606 may range from 1 to 50 Ohm-cm, typically, from 5 to 25 Ohm-cm.

The process of removing the sacrificial single crystal semiconductor handle substrate 100 may only expose a high-resistivity first single crystal semiconductor device layer 402 that is, unlike BOX, a good barrier against of low temperature contaminants. The CTL layer 406 prevents formation of parasitic conduction layers in the high-resistivity layer. Therefore, IC formed using the proposed SOI wafers preserved excellent RF performance.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a plurality of multilayer structures, the method comprising:
    (a) providing an initial bonded structure, the initial bonded structure comprising an initial single crystal semiconductor handle substrate, an initial dielectric layer in contact with a front surface of the initial single crystal semiconductor handle substrate, and an initial single crystal semiconductor donor substrate in contact with the initial dielectric layer, wherein the initial single crystal semiconductor donor substrate has a minimum bulk region resistivity of at least about 500 ohm-cm and further wherein the initial single crystal semiconductor donor substrate comprises an initial cleave plane;
    (b) mechanically cleaving the initial bonded structure at the initial cleave plane to thereby prepare an initial cleaved structure and a second single crystal semiconductor handle substrate, wherein the initial cleaved structure comprises the initial single crystal semiconductor handle substrate, the initial dielectric layer in contact with the front surface of the initial single crystal semiconductor handle substrate, and a first single crystal semiconductor device layer in contact with the initial dielectric layer, wherein the first single crystal semiconductor device layer has a minimum bulk region resistivity of at least about 500 ohm-cm and has a roughened front surface having a surface roughness of at least about 0.1 micrometers as measured according to the root mean square method over a surface area of at least 30 micrometers by 30 micrometers, and further wherein the second single crystal semiconductor handle substrate has a minimum bulk region resistivity of at least about 500 ohm-cm and has a roughened front surface having a surface roughness of at least about 0.1 micrometers as measured according to the root mean square method over a surface area of at least 30 micrometers by 30 micrometers;
    (c) depositing a first charge trapping layer on the roughened front surface of the first single crystal semiconductor device layer of the initial cleaved structure, the first charge trapping layer comprising polycrystalline silicon, the polycrystalline silicon comprising grains having a plurality of crystal orientations;

(d) bonding a first dielectric layer on a front surface of a first single crystal semiconductor donor substrate to the first charge trapping layer on the roughened front surface of the first single crystal semiconductor device layer of the initial cleaved structure to thereby prepare a first multilayer structure, the first multilayer structure comprising the initial single crystal semiconductor handle substrate, the initial dielectric layer in contact with the front surface of the initial single crystal semiconductor handle substrate, the first single crystal semiconductor device layer in contact with the initial dielectric layer, the first charge trapping layer in contact with the roughened front surface of the first single crystal semiconductor device layer, the first dielectric layer in contact with the first charge trapping layer, and the first single crystal semiconductor donor substrate in contact with the first dielectric layer;

(e) depositing a second charge trapping layer on the roughened front surface of the second single crystal semiconductor handle substrate, the second charge trapping layer comprising polycrystalline silicon, the polycrystalline silicon comprising grains having a plurality of crystal orientations; and (f) bonding a second dielectric layer on a front surface of a second single crystal semiconductor donor substrate to the second charge trapping layer on the roughened front surface of the second single crystal semiconductor handle substrate to thereby prepare a second multilayer structure, the second multilayer structure comprising the second single crystal semiconductor handle substrate, the second charge trapping layer in contact with the roughened front surface of the second single crystal semiconductor handle substrate, the second dielectric layer in contact with the second charge trapping layer, and the second single crystal semiconductor donor substrate in contact with the second dielectric layer.

2. The method of claim 1 wherein the surface roughness of the roughened front surface of the first single crystal semiconductor device layer is between about 0.1 micrometer and about 1 micrometer as measured according to the root mean square method over a surface area of at least 30 micrometers by 30 micrometers.

3. The method of claim 1 wherein the surface roughness of the roughened front surface of the second single crystal semiconductor handle substrate is between about 0.1 micrometer and about 1 micrometer as measured according to the root mean square method over a surface area of at least 30 micrometers by 30 micrometers.

4. The method of claim 1 wherein the plurality of crystal orientations of the polycrystalline silicon of the first charge trapping layer and the second charge trapping layer comprise at least two orientations selected from the group consisting of (111), (100), and (110).

5. The method of claim 1 further comprising heating the first multilayer structure at a temperature and for a duration sufficient to strengthen the bond between the first charge trapping layer in contact with the roughened front surface of the first single crystal semiconductor device layer and the first dielectric layer in contact with the first single crystal semiconductor donor substrate.

6. The method of claim 5 wherein the first single crystal semiconductor donor substrate comprises an ion implanted damage layer.

7. The method of claim 6 further comprising mechanically cleaving the first multilayer structure at the ion implanted damage layer of the first single crystal semiconductor donor substrate to thereby prepare a first cleaved structure comprising the initial single crystal semiconductor handle substrate, the initial dielectric layer in contact with the front surface of the initial single crystal semiconductor handle substrate, the first single crystal semiconductor device layer in contact with the initial dielectric layer, the first charge trapping layer in contact with the roughened front surface of the first single crystal semiconductor device layer, the first dielectric layer in contact with the first charge trapping layer, and a first single crystal semiconductor device layer.

8. The method of claim 1 further comprising heating the second multilayer structure at a temperature and for a duration sufficient to strengthen the bond between the second charge trapping layer in contact with the roughened front surface of the second single crystal semiconductor handle substrate and the second dielectric layer in contact with the second single crystal semiconductor donor substrate.

9. The method of claim 8 wherein the second single crystal semiconductor donor substrate comprises an ion implanted damage layer.

10. The method of claim 9 further comprising mechanically cleaving the second multilayer structure at the ion implanted damage layer of the second single crystal semiconductor donor substrate to thereby prepare a second cleaved structure comprising the second single crystal semiconductor handle substrate, the second charge trapping layer in contact with the roughened front surface of the second single crystal semiconductor handle substrate, the second dielectric layer in contact with the second charge trapping layer, and a second single crystal semiconductor device layer.

11. A multilayer structure comprising:
    a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate;
    a handle dielectric layer in interfacial contact with the front surface of the single crystal semiconductor handle substrate;
    a high resistivity single crystal semiconductor layer in interfacial contact with the dielectric layer, wherein the high resistivity single crystal semiconductor layer has a minimum bulk resistivity of at least about 500 ohm-cm and further comprises a roughened front surface having a surface roughness of at least about 0.1 micrometers as measured according to the root mean square method over a surface area of at least 30 micrometers by 30 micrometers;
    a charge trapping layer in interfacial contact with the roughened front surface of the high resistivity single crystal semiconductor layer, the charge trapping layer comprising polycrystalline silicon, the polycrystalline silicon comprising grains having a plurality of crystal orientations;
    a donor dielectric layer in interfacial contact with the charge trapping layer, and a single crystal semiconductor donor layer in interfacial contact with the donor dielectric layer.

12. The multilayer structure of claim 11 wherein the high resistivity single crystal semiconductor layer comprises silicon.

13. The multilayer structure of claim 11 wherein the high resistivity single crystal semiconductor layer comprises a silicon wafer sliced from a single crystal silicon ingot grown by the Czochralski method or the float zone method.

14. The multilayer structure of claim 11 wherein the high resistivity single crystal semiconductor layer has a bulk resistivity between about 500 Ohm-cm and about 100,000 Ohm-cm.

15. The multilayer structure of claim 11 wherein the high resistivity single crystal semiconductor layer has a bulk resistivity between about 1000 Ohm-cm and about 100,000 Ohm-cm.

16. The multilayer structure of claim 11 wherein the high resistivity single crystal semiconductor layer has a bulk resistivity between about 1000 ohm cm and about 10,000 Ohm-cm.

17. The multilayer structure of claim 11 wherein the high resistivity single crystal semiconductor layer has a bulk resistivity between about 2000 Ohm cm and about 10,000 Ohm-cm.

18. The multilayer structure of claim 11 wherein the high resistivity single crystal semiconductor layer has a bulk resistivity between about 3000 Ohm-cm and about 10,000 Ohm-cm.

19. The multilayer structure of claim 11 wherein the high resistivity single crystal semiconductor layer has a bulk resistivity between about 3000 Ohm cm and about 5,000 Ohm-cm.

20. The multilayer structure of claim 11 wherein the surface roughness of the roughened front surface of the high resistivity single crystal semiconductor layer substrate is between about 0.1 micrometer and about 1 micrometer as measured according to the root mean square method over a surface area of at least 30 micrometers by 30 micrometers.

21. The multilayer structure of claim 11 wherein the plurality of crystal orientations of the polycrystalline silicon comprising grains comprise at least two orientations selected from the group consisting of (111), (100), and (110).

22. The multilayer structure of claim 11 wherein each of the handle dielectric layer and the donor dielectric layer independently comprises a material selected from the group consisting of silicon dioxide, silicon nitride, hafnium oxide, titanium oxide, zirconium oxide, lanthanum oxide, barium oxide, and a combination thereof.

23. The multilayer structure of claim 11 wherein both of the handle dielectric layer and the donor dielectric layer comprise a buried oxide layer having a thickness of at least about 10 nanometer thick, such as between about 10 nanometers and about 10,000 nanometers, between about 10 nanometers and about 5,000 nanometers, or between about 100 nanometers and about 400 nanometers.

* * * * *